(12) United States Patent
Leeb

(10) Patent No.: US 6,238,802 B1
(45) Date of Patent: May 29, 2001

(54) LAMINATE FOR SEALING CAPSULES

(75) Inventor: Karl-Erik Leeb, Djurhamn (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 08/894,684

(22) PCT Filed: Mar. 19, 1996

(86) PCT No.: PCT/SE96/00343

§ 371 Date: Oct. 27, 1999

§ 102(e) Date: Oct. 27, 1999

(87) PCT Pub. No.: WO96/29202

PCT Pub. Date: Sep. 26, 1996

(30) Foreign Application Priority Data

Mar. 21, 1995 (SE) .................................................. 9501017

(51) Int. Cl.[7] ............................ B32B 15/08; H05K 5/06; H05K 9/00

(52) U.S. Cl. ........................ 428/457; 428/461; 428/463; 428/901; 174/250; 361/748; 156/288; 156/308.4

(58) Field of Search ..................................... 428/457, 461, 428/463, 216, 901; 174/250; 361/748; 156/288, 308.4

(56) References Cited

U.S. PATENT DOCUMENTS

| | | | |
|---|---|---|---|
| 3,725,169 | 4/1973 | Allen et al. | |
| 4,351,864 | * 9/1982 | Giannakidis | 428/31 |
| 4,439,810 | 3/1984 | Shimada et al. | |
| 4,629,640 | * 12/1986 | Akao | 428/35 |
| 4,788,099 | * 11/1988 | Fukushima | 428/215 |
| 4,894,264 | * 1/1990 | Akao | 428/34.2 |
| 5,017,429 | * 5/1991 | Akao | 428/461 |
| 5,376,446 | 12/1994 | Huang | |

FOREIGN PATENT DOCUMENTS

| | | |
|---|---|---|
| 2233958 | 2/1973 | (DE) . |
| 0 057 994 | 8/1982 | (EP) . |
| WO94/22181 | 9/1994 | (WO) . |

* cited by examiner

*Primary Examiner*—Daniel Zirker
(74) *Attorney, Agent, or Firm*—Burns, Doane, Swecker & Mathis, L.L.P.

(57) ABSTRACT

For sealing and shielding purposes, a laminate is used, including a layer of ionomer plastics bonded to a metal sheet or a metal plate. The bonding is made without any addition of adhesive agents between the plastics layer and the metal surface by pressing, in a heated state, the plastics layer against a well cleaned surface. The metal should be such a kind, that its surface is oxidized when stored in air. A multi-layer laminate is used, where one metal layer provides a good electrical shielding and an outermost metal layer provides good mechanical strength. The plastics layer at the inner side of a laminate is in the same way bonded directly to margins of electrical connector terminals made of metal.

16 Claims, 2 Drawing Sheets

LAMINATE FOR SEALING CAPSULES

TECHNICAL FIELD

The present invention relates to protection of delicate electric equipment, in particular to a laminate suitable for capsules for such equipment, and also to a method for manufacturing such laminates.

BACKGROUND OF THE INVENTION

Mechanical and electrical equipment, which is to be used in a difficult environment must often be protected thereagainst in order not to be damaged or interrupted in the its function.

In many cases enclosures are used which are type plastics. For more demanding applications laminates are used, for instance composed by several plastic materials, or by plastics and other materials such as metal sheets, in the established art. Laminates of plastics and metal have the advantage of being both non-permeable to diffusion of water vapour and of being electrically shielding. Depending on the metal layer and in particular the thickness thereof both flexible and stiff laminates can be obtained. The latter ones can also for certain material compositions be deep drawn, that provides a simple manufacturing method of boxes and lids for sealing and encapsulation.

The manufacture of plastic/metal laminates are usually performed in one of the two following manners:

1. One of the surfaces, which are to be joined, is coated with a polyurethane glue having a sticky consistency, whereafter the surfaces are pressed together in heat. The glue contains solvent, which must be removed by drying the glued materials in large, space-consuming drying machines. Moreover, an afterhardening of the glue must be made by storing the laminate for a couple of months in order for the water to diffuse into the glue for hardening it. The glue joints have a bad humidity resistance.
2. The plastics layer is extruded in the shape of a thin layer on a metal sheet path. High requirements are put on the wide slit nozzle used. Furthermore, commercially used extruders and their screws are large, which results in that a readjustment for extrusion of different materials is difficult, circumstantial and very time-consuming to perform. This is unsuitable for manufacturing laminated materials to be used in small series, when a flexible manufacturing method is required, such as is the case in making different types of capsules for example for delicate electronic circuits.

Also, plastic/metal laminates can be manufactured where the bonding to the metal layer is provided by a layer of ionomer plastics, where the bonding layer also can be the entire plastic component of the laminate, see e.g. the European patent application EP-A2 0 057 994, U.S. Pat. Nos. 5,376,446, 4,439,810, 3,725,169 and the German published patent application DE 2 233 958.

SUMMARY

The object of the present invention is to solve the above mentioned problems, which are associated with the established art.

In particular, an object of the invention is to provide a laminate suitable for protecting mechanically and shielding electrically electric and electronic components.

Another object is to provide laminates for protecting electrical components which can be manufactured at a lower cost in small series.

Another object is to provide a method for manufacturing such laminates, that can be used at a reasonable cost for electrical components used in small series.

Another object is to provide a method of protecting in a secure way delicate electrical components.

For sealing and shielding a laminate is used comprising a layer of ionomer plastics bonded to metal sheets and/or plates. The bonding is thus accomplished without addition of any adhesive agents between the plastics layer and the metal surface, and is obtained by pressing the plastics layer against a well cleaned metal surface in heat. The metals used shall be such that their surfaces are oxidized when stored in air. Thus a multi-layer laminate is provided, where one metal layer provides a good electrical shielding and an outermost metal layer provides a good mechanical strength and/or chemical resistance to corrosion. The plastics layer at the inside of a laminate bonds in the same manner directly at margins of electrical connectors made of metal.

Generally, a laminate for diffusion tight storing of objects comprises a metal layer and a polymer layer, in particular comprising a first layer of a metal, which is oxidized in air on its surface, and a second layer of an ionomer plastics material. These layers are directly bonded to each other, in particular by means of heating during compression. The temperature during the compression shall be such, that the material of the ionomer plastics layer is only half-melted or very viscous. After the compression in heat, a heat treatment at a higher temperature is advantageously conducted, at which the ionomer plastics layer is significantly more mobile than during the compression, which considerably increases the adherence between the layers of metal and of polymer. The second layer can be a surface material layer on a thermoplastics layer, in particular polythene or polypropene, which surface layer has been obtained by means of a suitable treatment of the layer of thermoplastics.

The laminate further has a third layer of a metal, which is also oxidized on its surface in air. This third layer is directly bonded to a layer of an ionomer plastics material, which can be the second layer or a surface material layer on the other side of the thermoplastics layer.

Furthermore, a fourth layer of an ionomer plastics material can be present, which is joined to the third layer, in particular so that this fourth layer is an inner layer of the laminate or so that it is a surface material layer on a base layer of thermoplastics.

The laminate is intended for sealing and encapsulation of electronic components, in particular for an electronic circuit board having electronic components mounted thereon, and then the first, outer metal layer is a mechanically strong and/or corrosion resistant metal material, such as a layer of a foil or a sheet of Ni or of steel plate. The third layer is then a metal layer having a good electrical conductivity, in particular Al or Cu. Further, the metal material layers are advantageously the kind, that are suitable for deep-drawing, so that for instance stiff capsules can be formed.

The different layers can have substantially the same thickness and for instance the different layers can have a thickness of about 50 µm.

When an extra good electrical shielding of a joint between such laminates is required, the joint can be short-circuited, for instance by means of a method that is described in the International patent application PCT/SE94/00255, which is incorporated herein by reference.

DESCRIPTION OF THE DRAWINGS

The invention will now be described in more detail by way of non-limiting embodiments with reference to the accompanying drawings, in which:

FIGS. 3a and 3b illustrate manufacturing procedures for the laminate of FIG. 2a.

DETAILED DESCRIPTION

A material, which when heated has a good adherence to many metal surfaces, is thermoplastic ionomers, such as the types of plastic materials that are commercially available under the name "Surlyn" from the company E. I. Du Pont de Nemours and Company, for example type 1652, or "Iotek" from the company Exxon Chemical Americas. These thermoplastic materials contain carbon chains having carboxylic side groups —$COO^-$ and these carboxylic groups are interconnected by means of zinc ions $Zn^{2+}$ and/or other metal ions such as sodium ions $Na^+$. The bonding to metal surfaces can in principle be conceived to occur by the metallic ion being attracted to negative charges associated with oxygen atoms at a metal surface that is at least partly oxidized. That this mechanism is operative is supported by the fact that no bonding or a bad bonding is obtained to non-oxidized metal surfaces, such as surfaces of gold Au, and that also ions having less charge such as $Na^+$ provides a poorer bonding than $Zn^{2+}$. Therefore, ionomer materials based on zinc ions are preferred herein, but of course thermoplastic ionomers based on other metal ions can be used, provided that they give the above mentioned good adherence to metal surfaces.

Hence, for a good adherence of the ionomer layer, the metal surfaces used need not to be extremely well cleaned but it is only needed to rid them of dirt, oil and possible particles. An oxide layer must remain on the metal surface. Typical materials to be used in metal layers or surfaces are nickel, aluminium, iron in the form of steel, for instance deep drawn steel, steel covered with a protective layer such as zincified steel, aluzinc, copper, etc. The metal can be present in the form of rigid metal plates, flexible metal sheets or metal foils, to which the ionomer layer is bonded.

Figure 1:
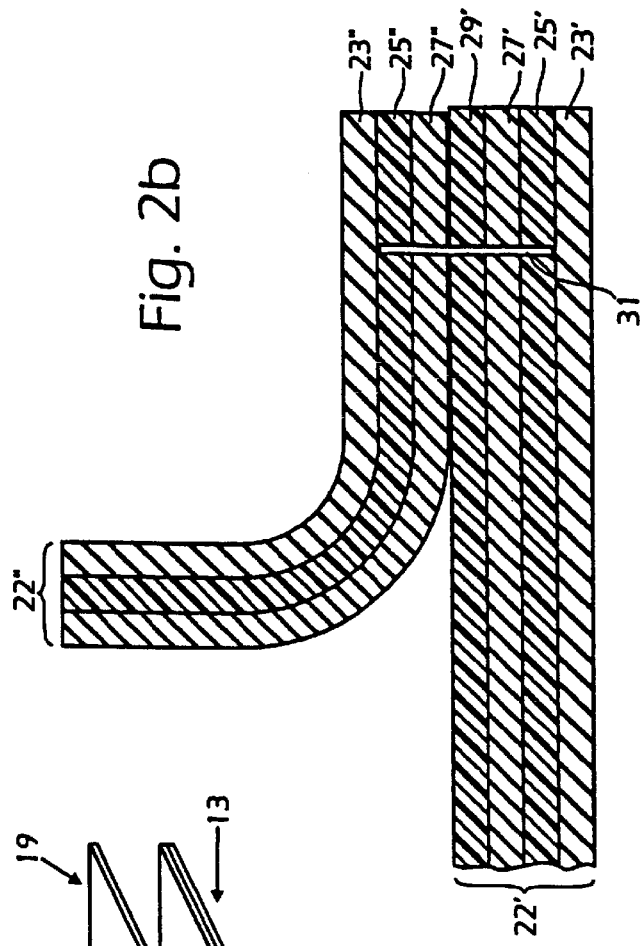
FIG. 1 is an exploded perspective view of an encapsulation for a printed circuit board, where a laminate has been used as a bottom plate.

In FIG. 1 an exploded perspective view of an encapsulation suitable for an electronic circuit board 11 is shown. The circuit board 11 is attached to a bottom part 13, which consists of a lower metal plate or metal sheet 15, for instance made of nickel, and a layer 17 of ionomer plastics attached thereon. The ionomer layer 17 can have been attached to the metal sheet 15 by means of pressing in heat, as will be described below. Exterior electrical connector terminals, not shown, can be provided in the lower plate 13. Further, there is a top part or a lid 19, which comprises a bowl-shaped, centrally located portion 20 for enclosing electronic components mounted on the circuit board 11 and a flange or marginal portion 21, which extends along the whole circumference of the upper portion 19 and has a flat lower surface. When sealing and encapsulating the circuit board 11 the upper part 19 is put in place onto the lower part 13, so that the lower surfaces of its flanges 21 come in contact with the marginal portions of the ionomer plastics layer 17. Then the compressive force and heat are applied to the whole marginal region, whereby a tight sealing and a mechanical fixing or cementation of the lid 19 to the lower part 13 is obtained.

Figure 2A:
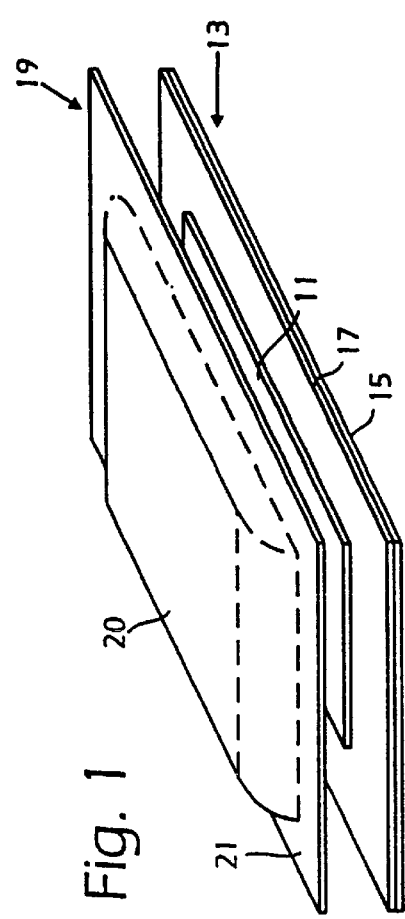
FIGS. 2a and 2b are sectional views of marginal areas of two joint laminates used for encapsulation and/or for shielding.

In encapsulating electronic components to be used at high frequencies it can be desirable to obtain a complete electrical shielding of the components inside the encapsulation. With the methods above, no completely tight encapsulation is obtained but a small area is obtained at the plastics material 17, where radio waves can leak in and out to the otherwise well shielded electronic circuits on the circuit board 11. A shielding of the marginal region can then be obtained in the manner described in the above mentioned International patent application. Then a contact element having protruding parts, which are inserted in the margin areas, where the sealing is obtained between the lower part and upper part 13, 19, is used. It can in this case be advantageous to arrange two metal layers in the encapsulating material. Laminates 22, 22' suitable for such a device are shown in FIG. 2a illustrating a sectional view of a marginal joint of two identical laminates. Outermost in such a laminate 22 there is an outer layer 23 of a corrosion resistant metal, such as nickel. Inside this layer there is an ionomer plastics layer 25 and inside it another metal layer 27. The metal layer 27 shall be a good electrical conductor and here aluminium can be chosen. Innermost there is yet another layer 29 of ionomer plastics. The different layers in the laminate can have approximately the same thickness and for instance thicknesses of 50 $\mu$m can be used.

The laminates illustrated in FIG. 2a are well suited, at least for the dimensions indicated above, for deep drawing for manufacturing for instance a lid 19 according to FIG. 1. In an electrical shielding of the marginal region two laminates 22, 22' of for instance the same kind are placed having the free ionomer plastics layers 29, 29' in contact with each other. Between the marginal areas of the laminates the elongated electrically conducting material having protruding parts, for instance in the shape of a thin metal strip turned into a screw shape, is placed as shown at 31 in FIG. 2a. When compressing and heating the marginal areas of the laminates parts of the metal strip 31 will then pass into the laminates 22 and 22' and for suitable material dimensions and material choices be pressed into and penetrate through the inner ionomer plastics layers 29, 29' and the inner, metal layers 27, 27', for instance made of aluminium. An electric contact is then obtained to the shielding, inner metal layers 27, 27' in the laminates 22, 22'. The contact material 31 then does not penetrate through the outer protecting material layers 23, 23', in particular if these are made of a material having a high mechanical strength such as nickel foil.

When using the laminates 22, 22' for manufacturing a shielding enclosure according to FIG. 1 the inner ionomer plastics layer 29 or 29' can possibly be excluded, however not within those regions, in which electrical connector terminals shall be arranged, since they are suitably sealed along their edges by means of compression in heat to an ionomer plastics layer. A sectional view of a marginal region of an encapsulation made of two different laminates 22" and 22' is shown in FIG. 2b.

Figure 2B:
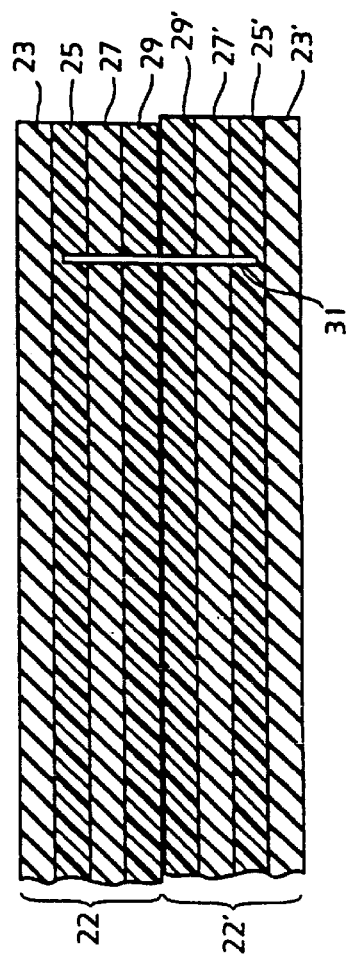
Figure 3A:
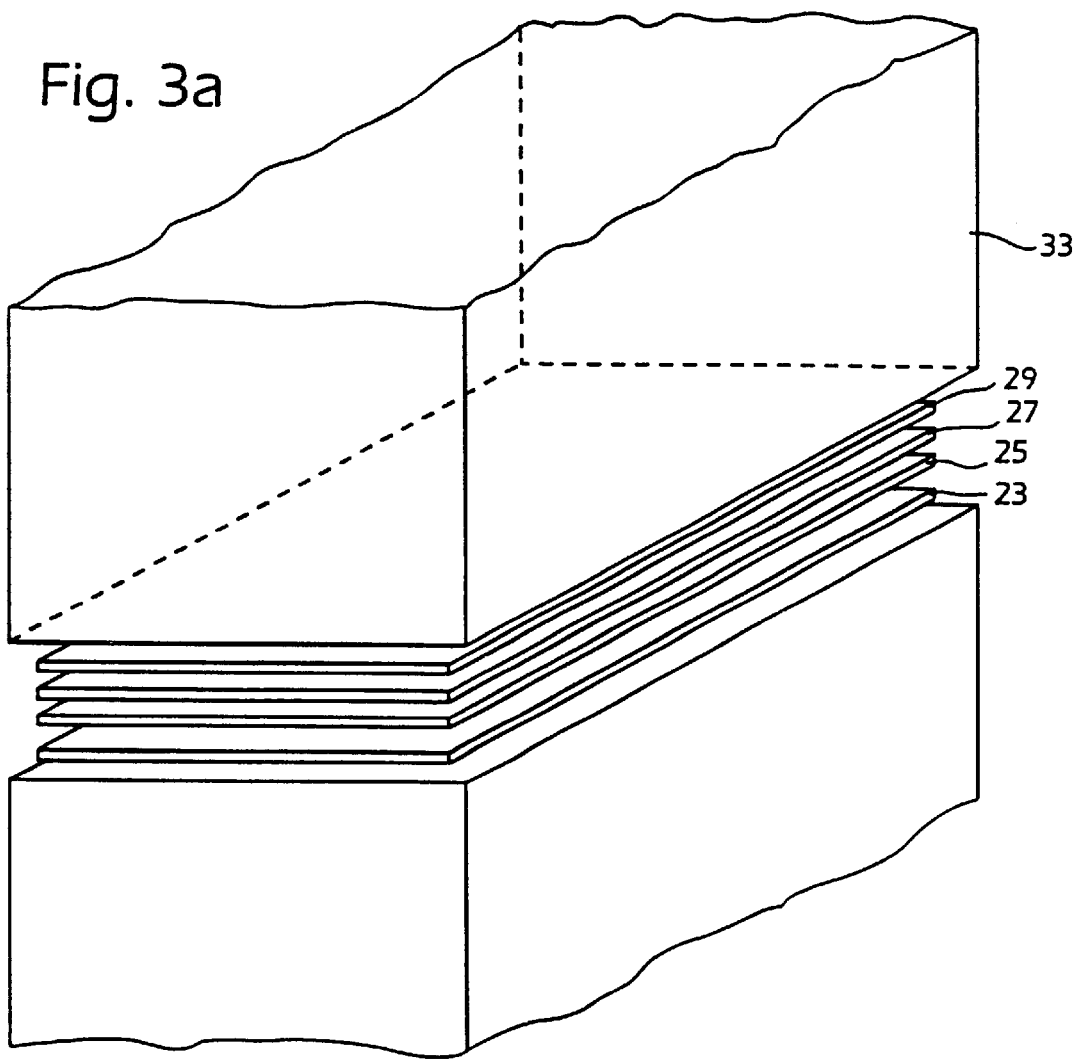
Figure 3B:
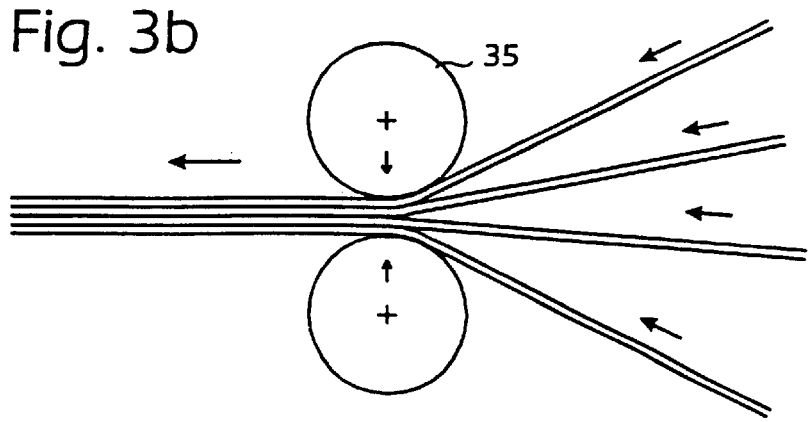

The laminates according to FIGS. 1, 2a or 2b can easily be manufactured by means of compression in heat, as for instance is shown schematically in FIG. 3a. For manufacturing the laminate 22 according to the embodiment in FIG. 2a the different sheets 23–29, cut into a suitable shape, are placed between heated compression surfaces of press plates 33 in a press. As an alternative the sheets or foils can be laminated together between heated cylinders 35, see FIG. 4b. After the compression, a heat treatment is conducted at a higher temperature in order to further increase the adherence between plastics and metal.

In an experiment for testing the adherence of an ionomer plastics layer to a metal sheet, a laminate comprising a surface layer of an aluminium sheet, an intermediate sheet of ionomer plastics of type 1652 Surlyn, an additional aluminium sheet and at the bottom an ionomer plastics layer were manufactured. All the layers present had a thickness of 50 μm and they were pressed together during a time period of 1 minute at a compression force of $1 \cdot 10^6$ N/m$^2$ at a temperature of 100° between pressing plates of the kind shown in FIG. 4. Thereupon a heat treatment was conducted without compression by maintaining the laminate in an oven having the temperature of 140° during 1 hour. After cooling, the laminate thus obtained was tested again by means of boiling under water for 15 hours. No traces of delamination were noticeable and in particular there were no traces of water penetration at the boundary between ionomer plastics and metal. In the corresponding treatment of a polythene sheet bonded to a metal sheet in a conventional manner by adhesive bonding using a polyurethane glue, a pronounced hydrolysis of the boundary between plastics and metal was clearly noticeable after boiling in water for 5 minutes.

Experiments have also been conducted for the laminate by maintaining it in a humid atmosphere—85% relative humidity and at a high temperature—85°. For the ionomer plastics laminate no change was noticeable after storage for 1500 hours while a change occurred in the bonding area between plastics and metal sheets after 200 hours for the corresponding conventionally manufactured laminate.

The pressing of the laminate should be performed at a temperature as high as possible, that is when the ionomer plastics layer or layers still are half molten and not too liquid. The good adherence between metal and ionomer plastics layer are considerably improved by the final heat treatment that should be made at a temperature where the plastics material has a low viscosity and flows easily. If the final heat treatment is performed at a lower temperature, for instance 120°, a maximal adherence is not obtained, while if higher temperatures, such as 160°, is used, the plastics layer or layers become milky white, which indicates a thermal decomposition of the plastics material.

What is claimed is:

1. An arrangement for sealing and encapsulating electronic components, comprising
   an outer metal layer of a mechanically strong and/or corrosion resistant material,
   a layer, inside the outer metal layer, of plastic material having at least surface layers of ionomer plastics material,
   an inner metal layer, inside the plastics layer, of a metal material different from the material of the outer metal layer and having a good electrical conductivity, and
   a circuit board disposed between the outer metal layer and the layer of plastic material, the circuit board having a plurality of electronic components mounted thereon and having a surface area less the other layers of the arrangement, such that when the circuit board is substantially centered within the arrangement and the layers are brought into contact with one another while apply a compressive force and heat, a seal is formed around the circuit board at the periphery of the arrangement.

2. The arrangement according to claim 1, wherein the layers of metal are of a kind which are suitable for deep drawing.

3. The arrangement according to claim 1, wherein the different layers have substantially the same thickness.

4. The arrangement according to claim 1, wherein the outer metal layer comprises a bulge projecting outwardly from the circuit board and arranged such that the electronic components do not touch the outer metal layer when the arrangement is sealed.

5. An arrangement for sealing and encapsulating electronic components, comprising:
   a first and a second laminate each comprising
      an outer metal layer made of a mechanically strong and/or corrosion resistant metal material,
      a layer located inside the outer metal layer and being of an ionomer thermoplastic material,
      an inner metal layer inside the ionomer thermoplastic material layer and being of a metal material that is different from the material of the outer metal layer and having good electrical conductivity,
      an innermost layer of a thermoplastic ionomer material, and
   a circuit board disposed between the innermost thermoplastic ionomer material layers of the first and second laminates, the circuit board having a plurality of electronic components mounted thereon and having a surface area less the first and second laminates, such that when the circuit board is substantially centered within the arrangement and the innermost thermoplastic ionomer material layers of the first and second laminates are brought into contact with one another while applying a compressive force and heat, a seal is formed around the circuit board at the periphery of the arrangement.

6. The arrangement according to claim 5, wherein the innermost layer is a surface material layer on a base layer of thermoplastics.

7. The arrangement according to claim 5, wherein the layers of metal material are of a kind which are suitable for deep drawings.

8. The arrangement according to claim 5, wherein the different layers have substantially the same thickness.

9. The arrangement according to claim 5, wherein at least one of the outer metal layers comprises a bulge projecting outwardly from the circuit board and arranged such that the electronic components do not touch the at least one outer metal layer when the arrangement is sealed.

10. The arrangement according to claim 5, further comprising at least one electrically conductive member located at the periphery of one of the inner metal layers and extending perpendicularly outward toward the innermost ionomer layer, such that when the first and second laminates are brought into contact with one another while applying a compressive force and heat, the at least one member extends through the innermost ionomer layer into the other inner most metal layer, providing an electrical connection between the inner metal layers of the arrangement.

11. A method of sealing and encapsulating electronic components, comprising the steps of:
    providing a first laminate comprising
       an outer metal layer of a mechanically strong and/or corrosion resistant metal material,
       a layer, inside the outer metal layer, of plastics material having at least surface layers of ionomer plastics material, and
       an inner metal layer, inside the plastics layer, of a metal material having a good electrical conductivity,
    providing a second laminate comprising
       an outer metal layer of a mechanically strong and/or corrosion resistant metal material,
       a layer, inside the outer metal layer, of plastics material having at least surface layers of ionomer plastics material,
       an inner metal layer, inside the plastic layer, of a metal material having a good electrical conductivity, and
       an innermost layer of a thermoplastic ionomer material,
    placing a circuit board having a plurality of electrical components mounted thereon on a surface opposite the outer metal layer of one of the laminates, at an inner region thereof, and pressing marginal regions of each laminate to each other in heat, the inner layers of the laminates facing each other, to provide a sealing along edges of the laminates and thus a sealed enclosure of the electrical components.

12. A method according to claim 11, wherein in providing the first laminate, it is also given an innermost layer of a thermoplastic ionomer material.

13. A method according to claim 11, wherein before the pressing step at least one of the laminates is deep drawn to a suitable shape.

14. The arrangement according to claim 11, wherein at least one of the outer metal layers comprises a bulge projecting outwardly from the circuit board and arranged such that the electronic components do not touch the at least one outer metal layer when the arrangement is sealed.

15. The arrangement according to claim 11, further comprising at least one electrically conductive member located at the periphery of one of the inner metal layers and extending perpendicularly outward toward the innermost ionomer layer, such that when the marginal regions of each laminate are pressed toward each other in heat, the at least one member extends through the innermost ionomer layer into the other inner most metal layer, providing an electrical connection between the inner metal layers of the arrangement.

16. A method for diffusion tight sealing of objects, comprising the steps of:

oxidizing in air a surface of a first layer of a metal and a surface of a second layer of a metal, the second layer of metal being of a different material than the first layer of metal, pressing the oxidized surfaces of the first and second metal layers together with a layer of an ionomer plastics material and an object to be sealed disposed there between in heat with a direct contact existing between the oxidized surfaces of the metal layers and the ionomer plastics layer at least at the periphery of the metal layers surrounding the object, the temperature during the pressing step being such that the material in the ionomer plastics layer is only half molten or very viscous, and conducting, after the pressing step, a heat treatment at a higher temperature, at which the ionomer plastics layer is considerably more mobile than during the pressing step.

* * * * *